(12) United States Patent
Zhu

(10) Patent No.: US 10,917,029 B2
(45) Date of Patent: *Feb. 9, 2021

(54) PI SOURCE INVERTER-CONVERTER FOR HYBRID ELECTRIC VEHICLES

(71) Applicant: Vitesco Technologies USA, LLC, Auburn Hills, MI (US)

(72) Inventor: Ping Zhu, Auburn Hills, MI (US)

(73) Assignee: Vitesco Technologies USA, LLC, Auburn Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/594,976

(22) Filed: Oct. 7, 2019

(65) Prior Publication Data

US 2020/0119679 A1    Apr. 16, 2020

Related U.S. Application Data

(63) Continuation-in-part of application No. 15/921,284, filed on Mar. 14, 2018, now Pat. No. 10,468,968.

(Continued)

(51) Int. Cl.
*H02P 23/04* (2006.01)
*H03H 7/01* (2006.01)
(Continued)

(52) U.S. Cl.
CPC ........... *H02P 23/04* (2013.01); *H03H 7/0115* (2013.01); *B60K 6/26* (2013.01); *B60K 2006/268* (2013.01);
(Continued)

(58) Field of Classification Search
CPC ... H02M 7/487; H02M 5/458; H02M 7/53873
See application file for complete search history.

(56) References Cited

U.S. PATENT DOCUMENTS 3,820,006 A     6/1974 Phillips
6,137,704 A *  10/2000 Ito ......................... H02M 5/458
                                                        363/132

(Continued)

FOREIGN PATENT DOCUMENTS

CN    101277074 A    10/2008
EP      2112015 A1   10/2009
EP      2358623 A1    8/2011

*Primary Examiner* — Rina I Duda

(57) ABSTRACT

A system for reducing a resonant oscillation on a direct current bus is disclosed. The system includes a battery, a first capacitor connected in parallel with the battery, and an inductor connected in series with the first capacitor. The system also includes a first element connected in series with the inductor, a second element connected in parallel with the inductor and the first element, and a second capacitor connected in series with the first element. The system also includes an electric machine connected to the second capacitor. During a re-generation mode for charging the battery, a re-generation current flows from the electric machine to the battery, passing through the first element and the inductor and bypassing the second element. Additionally, during a motor mode, a motor current flows from the battery to the electric machine, passing through the second element and bypassing the first element and the inductor.

14 Claims, 18 Drawing Sheets

Related U.S. Application Data

(60) Provisional application No. 62/473,012, filed on Mar. 17, 2017, provisional application No. 62/620,259, filed on Jan. 22, 2018.

(51) Int. Cl.
    *B60K 6/26*         (2007.10)
    *B60L 50/60*      (2019.01)

(52) U.S. Cl.
    CPC ............ *B60L 50/60* (2019.02); *B60L 2210/10* (2013.01); *B60Y 2200/91* (2013.01); *B60Y 2200/92* (2013.01); *B60Y 2400/61* (2013.01)

(56) References Cited

U.S. PATENT DOCUMENTS

| | | | |
|---|---|---|---|
| 7,706,163 B2 * | 4/2010 | Tan | H02M 7/487 |
| | | | 363/132 |
| 8,143,856 B2 | 3/2012 | Andrea et al. | |
| 8,558,492 B2 * | 10/2013 | Oh | H02J 7/345 |
| | | | 318/400.21 |
| 8,816,641 B2 | 8/2014 | Andrea et al. | |
| 2004/0062059 A1 | 4/2004 | Cheng et al. | |
| 2006/0103341 A1 | 5/2006 | Steigerwald et al. | |
| 2007/0176574 A1 * | 8/2007 | Degner | B60L 50/51 |
| | | | 318/800 |
| 2007/0236965 A1 | 10/2007 | Chen et al. | |
| 2009/0237042 A1 | 9/2009 | Glovinski | |
| 2012/0019231 A1 | 1/2012 | Chen | |
| 2012/0104988 A1 * | 5/2012 | Ramu | H02K 1/32 |
| | | | 318/722 |

* cited by examiner

Sub Model of "PM Synchronous Motor Drive" Shows the Detailed Circuit Topology of the PI Source Inverter (C-L-C)

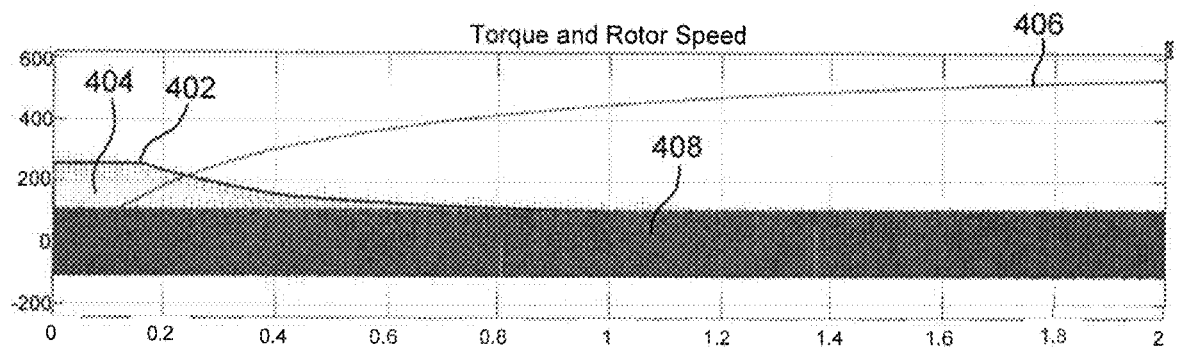
FIG. 4B-1 – Prior Art
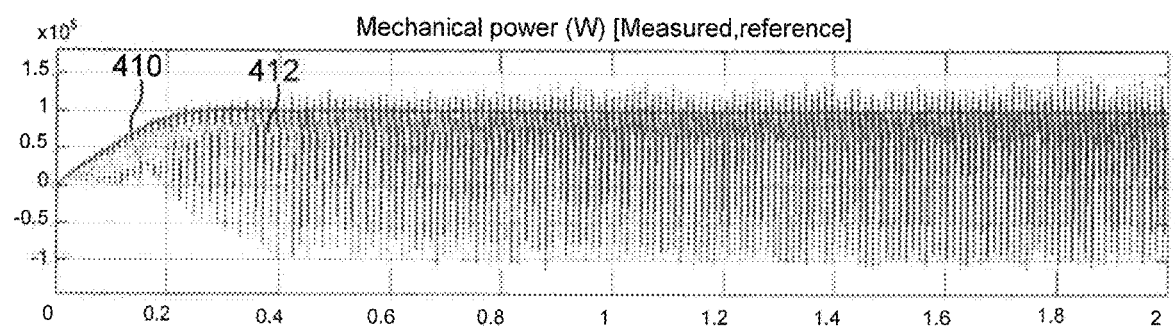
FIG. 4B-2 – Prior Art
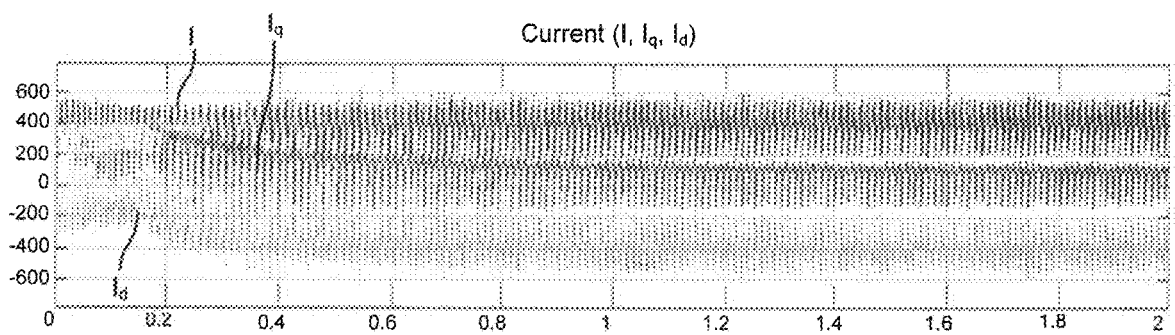
FIG. 4B-3 – Prior Art
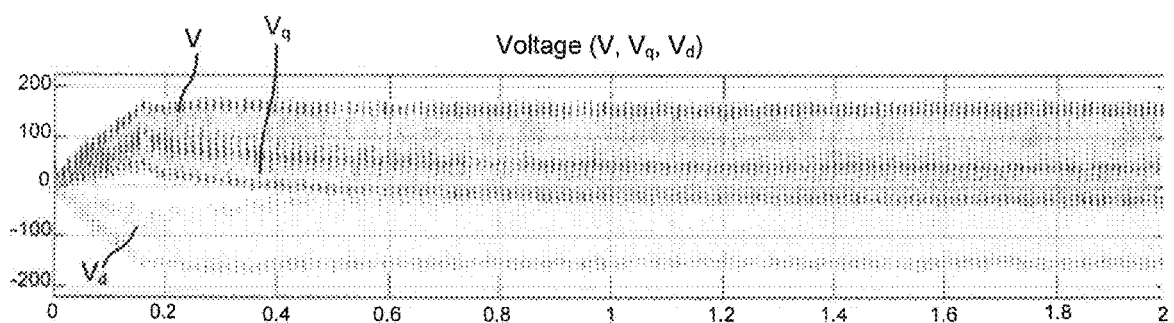
FIG. 4B-4 – Prior Art AC3 – Field-Oriented Control Induction 200 HP Motor Drive Sub Model of "Field-Orient-Control Induction Motor Drive" Shows the Detailed Circuit Topology of the PI Source Inverter (C-L-C)

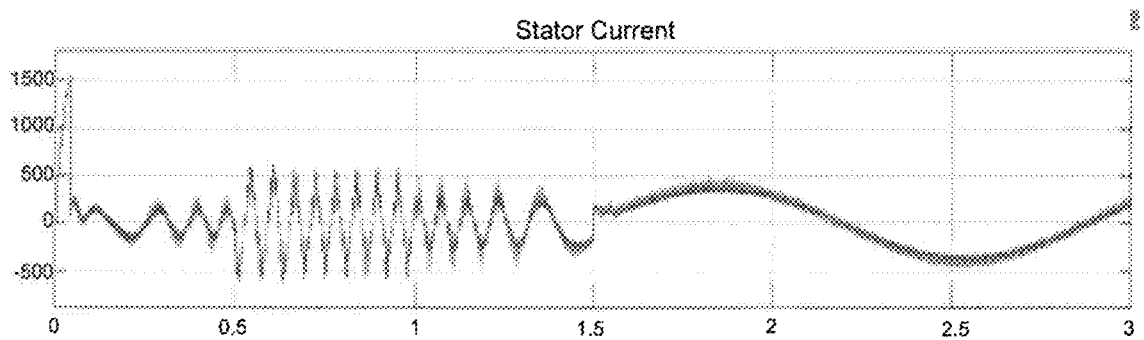
FIG. 7B-1 – Prior Art
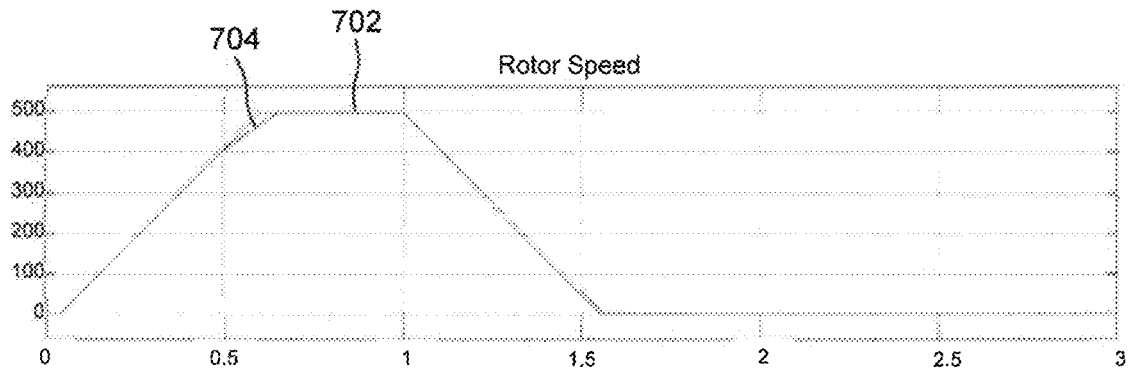
FIG. 7B-2 – Prior Art
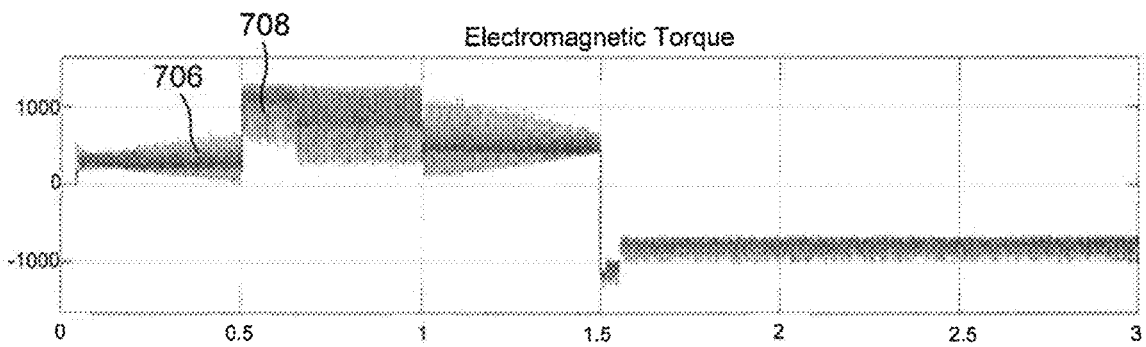
FIG. 7B-3 – Prior Art
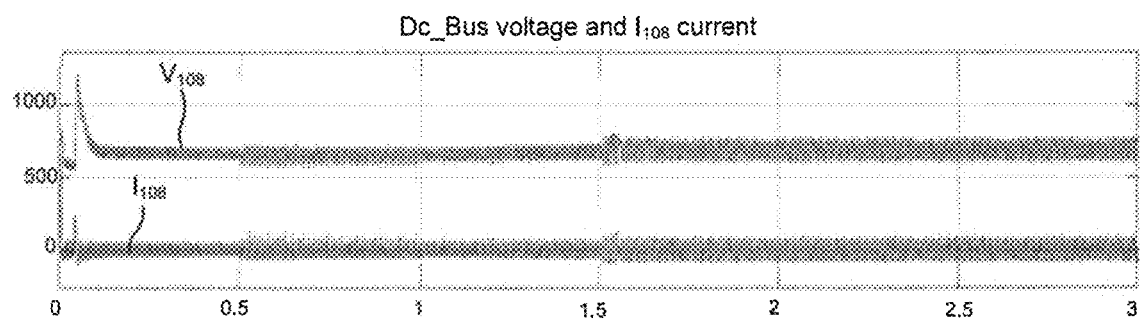
FIG. 7B-4 – Prior Art

PI SOURCE INVERTER-CONVERTER FOR HYBRID ELECTRIC VEHICLES

CROSS REFERENCE TO RELATED APPLICATIONS

This U.S. patent application is a continuation in part of, and claims priority under 35 U.S.C. § 120 from, U.S. patent application Ser. No. 15/921,284, filed on Mar. 14, 2018, which claims priority under 35 U.S.C. § 119(e) to U.S. Provisional Application 62/620,259, filed on Jan. 1, 2018 and U.S. Provisional Application 62/473,012, filed on Mar. 17, 2017. The disclosures of these prior applications are considered part of the disclosure of this application and are hereby incorporated by reference in their entireties.

TECHNICAL FIELD

This disclosure relates to Pi Source Inverter-Converter for Hybrid Electric Vehicles (HEVs).

BACKGROUND

Hybrid electric vehicles (HEVs) are a type of hybrid vehicles and electric vehicles that combine a conventional internal combustion engine (ICE) propulsion system and an electric propulsion system (hybrid vehicle drivetrain). HEVs achieve better fuel economy than conventional vehicles. Several types of HEVs exist, and the degree to which each functions as an electric vehicle varies as well. Hybrid electric cars are the most common of the HEVs; however, there is a recent surge in hybrid electric trucks and buses.

HEVs may be classified based on how power is supplied to their drivetrain. For example, HEVs may be classified as parallel hybrids, series hybrids, or power-split hybrids. Most hybrid vehicles use regenerative braking to recharge the batteries.

HEVs may include a variable frequency drive (VFD), which is a type of motor controller that drives an electric motor by varying the frequency and voltage supplied to the electric motor. VFDs may also be known as variable speed drive, adjustable speed drive, adjustable frequency drive, AC drive, microdrive, and inverter. Frequency or hertz is directly related to the speed of the motor, more specifically to its rotations per minute (RPM). In some examples, if the vehicle does not need an electric motor to run at full speed, the VFD may be used to ramp down the frequency and voltage to meet the requirements of the load of the HEV. Similarly, as the need for speed requirements changes, the VFD can turn up or turn down the motor speed to meet the speed requirements.

FIG. 1 shows a conventional and common topology of a system 100 of a main power section of a VFD of an HEV As shown, the VFD includes a three-phase inverter 102 having six MOSFETS M1-M6, each including a diode. The system 100 includes a starter-generator 104 that provides mechanical power to an engine shaft (not shown) during a motor mode and provides electrical power to a battery 106 during a re-generation mode. The system 100 requires bi-directional power flow between the starter-generator 104 and the battery 106. In other words, a current I (e.g., $I_{Motor}$ and $I_{Re-Generation}$) is able to flow bi-directionally within the DC-Bus 108 based on the operational mode of the vehicle (i.e., motor mode or re-generation mode). The power, i.e., current $I_{Motor}$, flows from the battery 106 to the starter-generator 104 through the 3-phase inverter 102 during the motor mode, while the power, i.e., current $I_{Re-Generation}$, flows from the starter-generator 104 (i.e., induction machine) to the battery 106 through the 3-phase inverter 102 during the motor re-generation mode. As can be seen, the 3-phase inverter 102 is configured to operate differently based on the motor mode. For example, during the motor mode, the 3-phase inverter 102 acts as an inverter from DC to 3-phase AC sinusoidal; while the 3-phase inverter 102 acts as a converter from 3-phase AC sinusoidal to DC.

An inductor 110, positioned in series between the first and second capacitors 118, 120, is used due to EMC regulation constraint by the automotive industry to eliminate the emissions from the converter 102 during the re-generating mode. In fact, the inductor 110 is only used during the Re-Generation mode to filter the battery charging current $I_{Re-Generation}$ through the inductor 110 and a first capacitor 118 connected in series with the inductor 110, which together are referred to as an L-C filter 116.

The Energy Stored in the inductor 110 may be calculated as follows:

$$\text{Motor Mode}: E_{L-Motor} = \frac{L * I_{Motor}^2}{2} \quad (1)$$

where $E_{L-Motor}$ is the energy stored in the inductor 110 during motor mode, L is the value of the inductor 110, and $I_{Motor}$ is the current passing through the inductor 110 during motor mode.

$$\text{Re-Generation Mode}: E_{L-Re-generation} = \frac{L * I_{Re-Generation}^2}{2} \quad (2)$$

where $E_{L-Re-Generation}$ is the energy stored in the inductor 110 during the re-generation mode, and L is the value of the inductor 110, and $I_{Re-Generation}$ is the current flowing from the starter-generator 104 through the 3-phase converter 102 to the battery 106 during the re-generation mode.

The Resonant Oscillation on the L-C filter 116: the current flowing in the inductor 110 is 180° lagging the current flowing in the first and second capacitors 118, 120. As such, the energy stored in the first capacitor 118 and the second capacitor 120 may be calculated as follows:

$$E_{C1} = \frac{C_1 * V^2}{2}; \text{ and} \quad (3)$$

$$E_{C2} = \frac{C_2 * V^2}{2}, \quad (4)$$

where $E_{C1}$ is the energy stored at the first capacitor 118, and $E_{C2}$ is the energy stored at the second capacitor 120, $C_1$ is the value of the first capacitor 118, and $C_2$ is the value of the second capacitor 120.

The energy exchange between the inductor 110 and the first capacitor 118 as well as the second capacitor 120 with 180° phase differences causes a resonant oscillation in the current during the motor mode and re-generation mode and provides ripple current on both of the capacitor 118 and capacitor 120.

More importantly, the torque of the starter-generator 104 is directly related and proportional to its winding's torque current especially at Field-Oriented-Control scheme of the starter-generator 104, and therefore the Ripple-Current on the DC-Bus 108. In other words, the Resonant-Oscillation current (e.g., $I_{Re-Generation}$, $I_{Motor}$) is proportional to the torque applied to the starter-generator 104.

As described previously, the Ripple-Current (Resonant-Oscillation current) on the DC-Bus 108 is proportional to the torque applied to the starter-generator 104, so the performance and the total output power delivered to the starter-generator 104 are greatly limited by the Resonant-Oscillation of the inductor 110 and the first capacitor 118 known together as the L-C filter 116. The Ripple-Current effect may damage the components of the main power and reduce the overall performance of the main power component significantly. The system 100 as described in FIG. 1, reduces the lifetime of the main power component even with a larger power rating of the main power components. In addition, the Ripple-Current effect may increase the emission to the surrounding area from an EMC perspective. As such, the system 100 may not be stable and prevents the starter-generator 104 from being used at its full designed power. Accordingly, there exists a need for a stable system that utilized the full designed power of the starter-generator 104.

SUMMARY

One aspect of the disclosure provides a system for reducing a resonant oscillation on a direct current bus of a power inverter/converter for an electric machine having a variable frequency drive. The system includes: a battery; a first capacitor connected in parallel with the battery; an inductor connected in series with the first capacitor; a first diode connected in series with the inductor; a second diode connected in parallel with the inductor and the first diode; a second capacitor connected in series with the first diode; and a starter-generator connected to the second capacitor. During a re-generation mode for charging the battery, a re-generation current flows from the starter-generator to the battery, passing through the first diode and the inductor and bypassing the second diode. In addition, during a motor mode, a motor current flows from the battery to the starter-generator, passing through the second diode and bypassing the first diode and the inductor.

Implementations of the disclosure may include one or more of the following optional features. In some implementations, the first capacitor and the inductor form an L-C filter. In some examples, during the re-generation mode for charging the battery, the re-generation current flows through the first capacitor and the inductor respectively. In some implementations, during the motor mode, the motor current flows through the second diode.

In some examples, the system further includes a power inverter/converter connected between the starter-generator and the second capacitor. The power inverter/converter may include six MOSFETS each including a diode. In some implementations, during the motor mode, the power inverter/converter includes an inverter from DC to 3-phase AC sinusoidal. In addition, during the re-generation mode, the power inverter/converter may include a converter from 3-phase AC sinusoidal to DC.

Another aspect of the disclosure provides a system for reducing a resonant oscillation, for example, on a direct current bus of a power inverter/converter for an electric machine having a variable frequency drive. The system includes a battery, a first capacitor connected in parallel with the battery, and an inductor connected in series with the first capacitor. The system also includes a first element connected in series with the inductor, a second element connected in parallel with the inductor and the first element, a second capacitor connected in series with the first element, and an electric machine connected to the second capacitor. The electric machine may include a starter-generator, a bi-directional load, or an on-board charger. During a re-generation mode for charging the battery, a re-generation current flows from electric machine to the battery, passing through the first element and the inductor and bypassing the second element. In addition, during a motor mode, a motor current flows from the battery to the electric machine, passing through the second element and bypassing the first element and the inductor.

Implementations of this aspect of the disclosure may include one or more of the following optional features. In some implementations, the first element is a MOSFET. Additionally or alternatively, the second element may be a MOSFET. In some examples, the first capacitor and the inductor form an L-C filter.

During the re-generation mode for charging the battery, the re-generation current may flow through the first capacitor and the inductor respectively. During the motor mode, the motor current may flow through the second element.

In some examples, the system further includes a power inverter/converter connected between the electric machine and the second capacitor. The power inverter/converter may include six MOSFETS each including a diode. In some examples, the power inverter/converter includes six at least insulated-gate bipolar transistors (IGBT). The power inverter/converter may include a four quadrant DC-DC converter or the power inverter/converter includes a two quadrant DC-DC converter. In some implementations, during the motor mode, the power inverter/converter includes an inverter from DC to 3-phase AC sinusoidal; and during the re-generation mode, the power inverter/converter includes a converter from 3-phase AC sinusoidal to DC.

The details of one or more implementations of the disclosure are set forth in the accompanying drawings and the description below. Other aspects, features, and advantages will be apparent from the description and drawings, and from the claims.

DESCRIPTION OF DRAWINGS

FIG. 4B-1-4B-4 is a graph showing the simulation results of FIG. 4A, which shows the resonant oscillation on most of the parameter values.

FIG. 5B-1-5B-4 is a graph showing the simulation results of FIG. 5A that show the effect of eliminating the resonant oscillation on all of the parameter values.

FIG. 7B-1-7B-4 is a graph showing the simulation results of FIG. 7A that show the resonant oscillation on most of the parameter values.

FIG. 8B-1-8B-4 is a graph showing the simulation results of FIG. 8A which shows the effect of elimination of resonant oscillation on all of the parameter values.

Like reference symbols in the various drawings indicate like elements.

DETAILED DESCRIPTION

Figure 1:
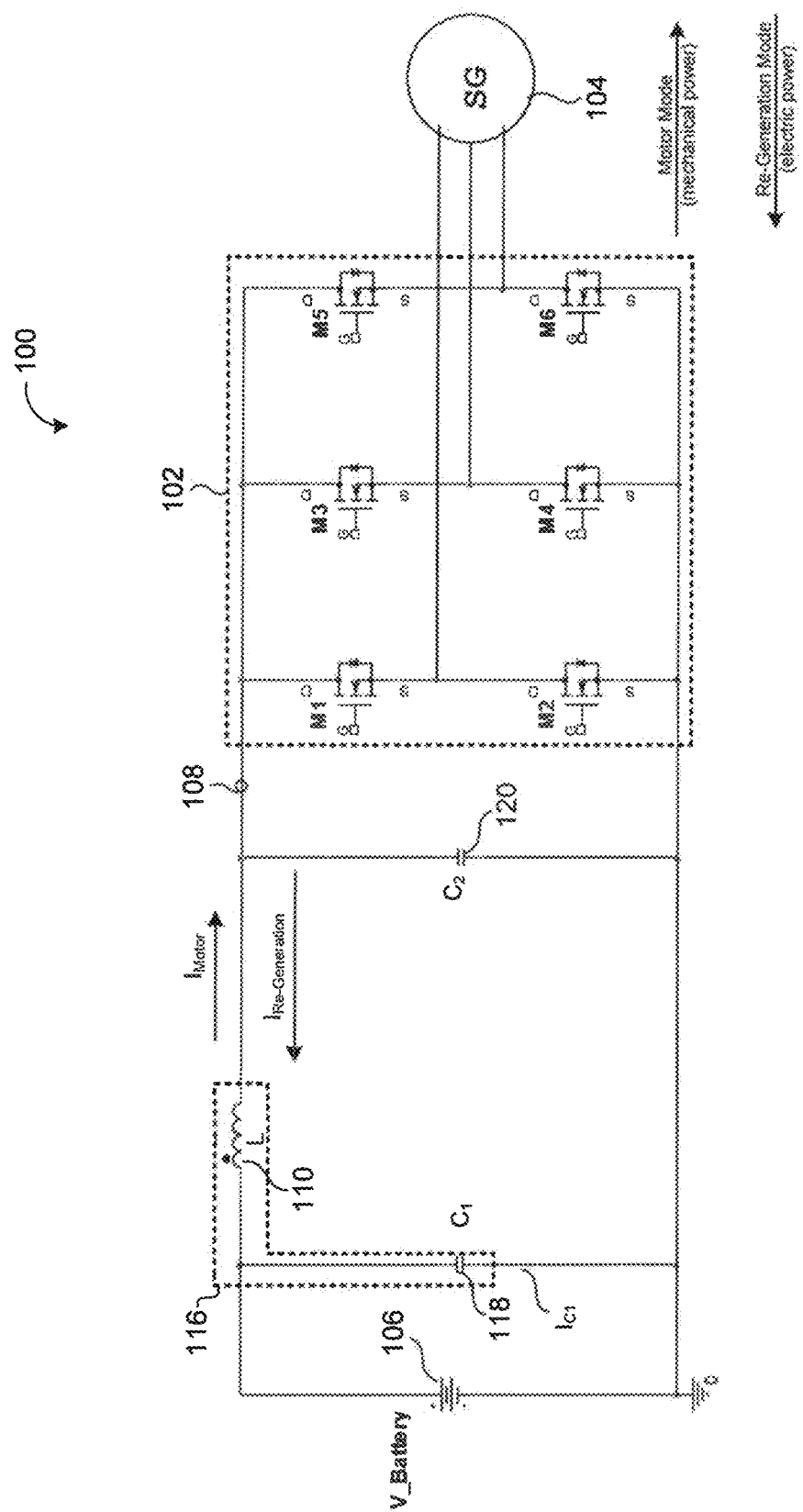
FIG. 1 is a schematic view of a prior art topology of a main power section for a starter-generator.

Referring to FIGS. 2A-2H, in some implementations, a system 200, 200a-200g significantly reduces a resonant oscillation on a DC (direct current) bus 202 of a power inverter/converter 204 for an electric machine 206 having a variable frequency drive (VFD). The reduction in resonant oscillation on the DC bus 202 leads to a belt starter generator (BSG or SG) 206 operating at its full designed power without any power reduction. Such system 200 may also result in reducing a current rating on an inductor 208 of the system 200 for example, from 260A to 40A, as well as the current rating of a first capacitor 218. In addition, the overall variable frequency drive system 200, including the DC-BUS 202 and inverter/converter 204 as well as the starter-generator 206 (e.g., induction machine), may all operate at a stable condition. As such, the system 200 is a stable system in comparison to previous system (for example, the system 100 shown in FIG. 1).

Figure 5A:
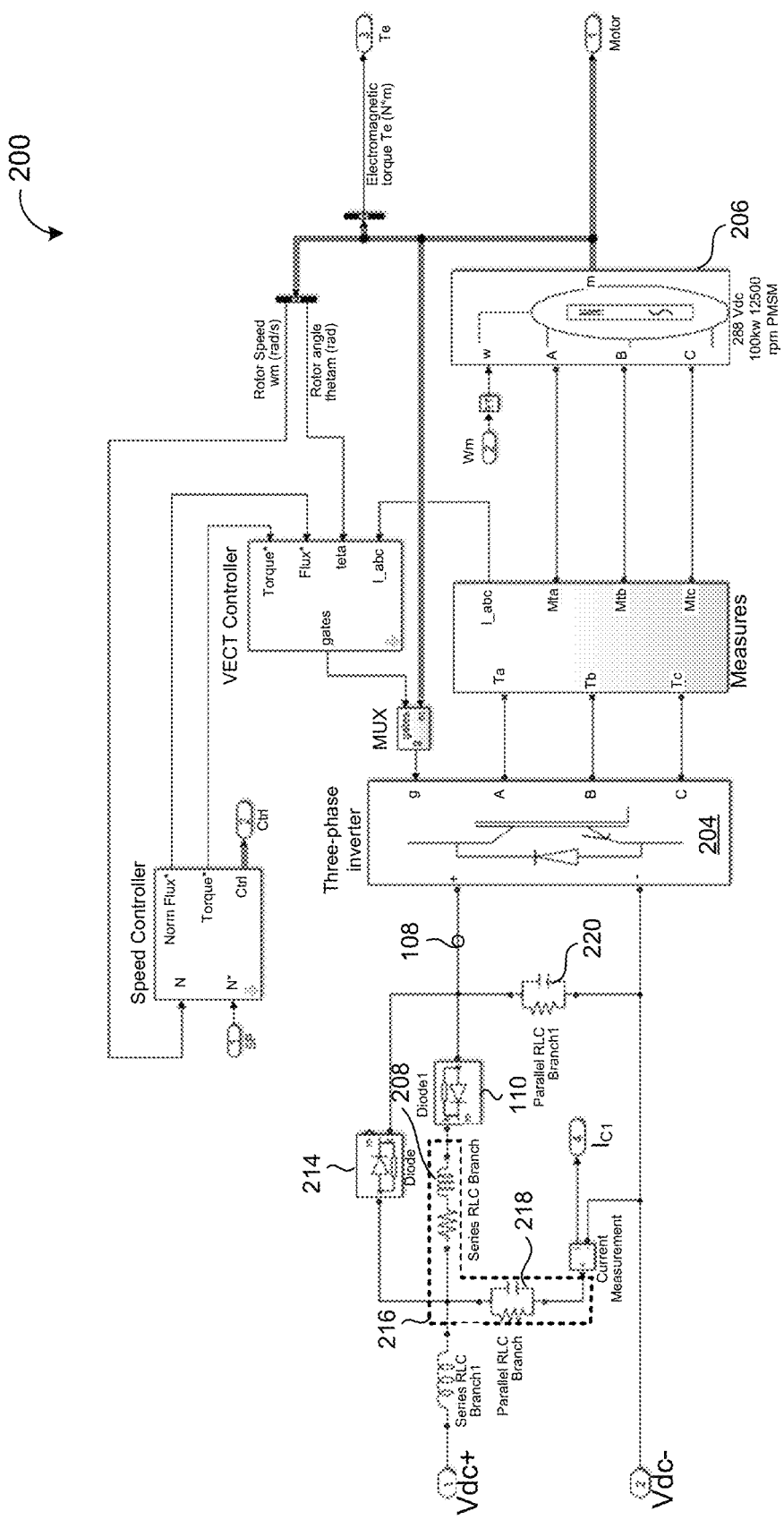
FIG. 5A is a Simulink Model view of a sub-model of a permanent magnet synchronous motor drive based on the system of FIG. 3 for eliminating the resonant oscillation, in accordance with FIG. 2.
Figures 1, 5B:
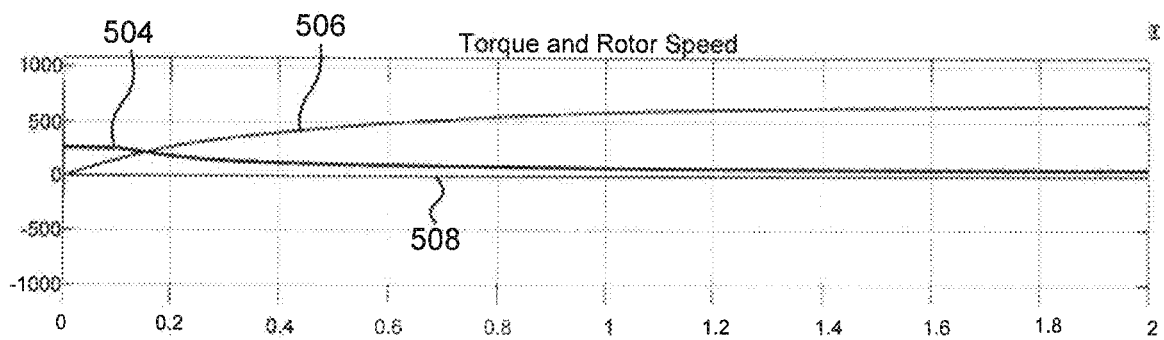
Figures 2, 5B:
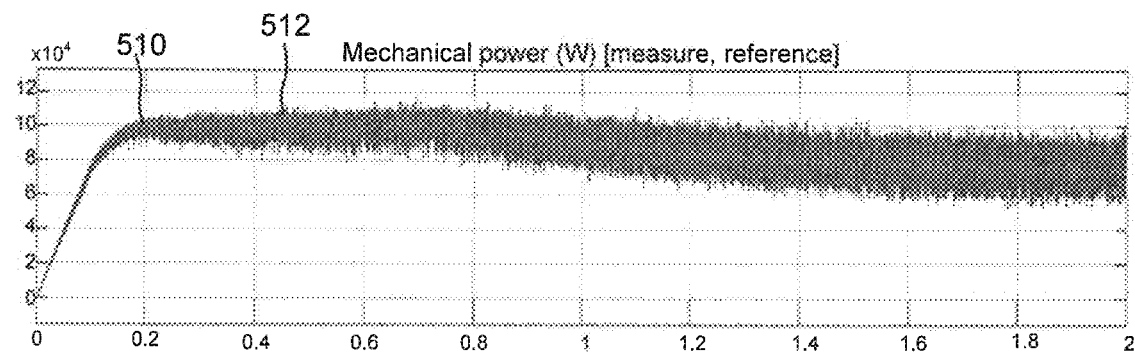
Figures 3, 5B:
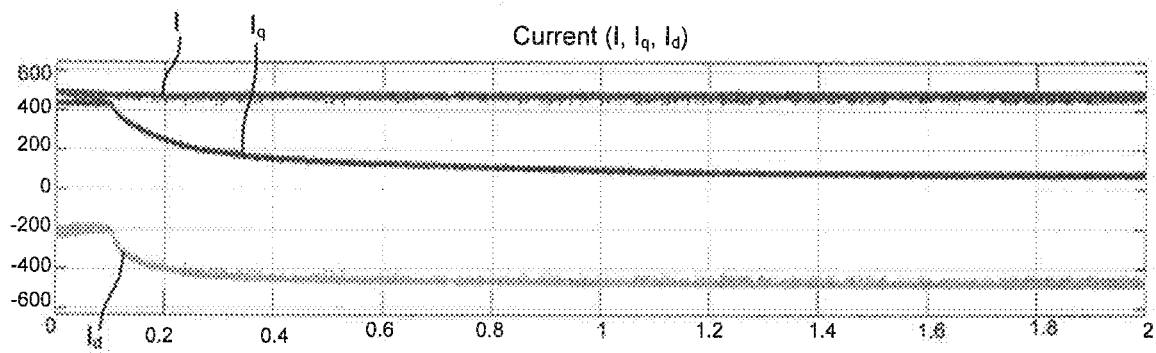

FIG. 2 shows the main power system 200a of a VFD of an HEV As shown, the system 200a includes a 3-phase inverter 204 having six MOSFETS M1-M6, each including a diode. The system 200a includes a starter-generator 206a, also referred to as an induction machine, which provides mechanical power to the engine shaft (not shown) during a motor mode, and provides electrical power to the battery 210 during a re-generation mode. Therefore, the system 200a provides bi-directional power flow based on the operational mode of the vehicle (motor mode or re-generation mode). The power flows from the battery 210 to the starter-generator 206 through the 3-phase inverter 204 during the motor mode, while the power flows from the starter-generator 206 to the battery through the converter 204 during the re-generation mode.

The system 200a is designed to manipulate the power that flows through the inductor 208 based on the two different operational modes, such as, the motor mode and the re-generation mode. The system 200a includes two diodes 212, 214, a first diode 212 and a second diode 214, on the DC bus 202 that are passive components, i.e., without a driver or trigger circuit. The first diode 212 is connected in series with the inductor 208, and the second diode 214 is connected in parallel with the inductor 208 and the first diode 212. Therefore, during the motor mode, the current $I_{Motor}$ going from the battery 210 to the starter-generator 206 bypassed the inductor 208. While during the re-generation mode, the battery charging current $I_{Re-Generation}$ going from the starter-generator 206 to the battery 210 passes through the first diode 212 and the inductor 208. During motor mode, the inductor 208 is not allowed to be charged since the current $I_{Motor}$ within the bus 202 bypasses the inductor 208 and flows through the second diode 214. Therefore, during the motor mode, the inductor 208 does not store any energy and thus no resonant oscillation occurs. Since no energy is stored in the inductor 208, then there will be no resonant oscillation. During the re-generation mode, the battery charging current $I_{Re-generation}$ flows through the inductor 208 to ensure the battery charging current $I_{Re-generation}$ is being filtered by the L-C filter 216 that includes the inductor 208 and a first capacitor 218 connected in series with the inductor 208.

The system 200, 200a-200g ensures that the VFD systems are more stable and reliable in comparison to the prior systems shown in FIG. 1 before including the diodes 212, 214. Therefore, it is possible for the VFD systems to fully function without any power de-rating which significantly contributes to the customer for a better HEV energy saving effect.

The system 200 as described in the disclosure is a simple and straight forward method that allows for the use of cheap passive components, such as the use of capacitors 218, 220 having a lower capacitance, and the use of the two diodes 212, 214, which results in the use of the full power rating of the starter-generator 206. Therefore, the system 200, 200a-200g as shown in FIGS. 2A-2G is configured to eliminate the resonant oscillation with a Pi Source Inverter-Converter with Bi-Directional Power Flow to overcome the setbacks of the previous systems as described in FIG. 1.

The motoring current $I_{Motor}$ does not flow through the inductor 208. The inductor 208 is only required to be functional as an L-C filter 216 at the Re-Generation mode to keep the battery charging current $I_{Re-Generation}$ at a highest quality. As such, the system 200 shown is configured to allow the motoring current $I_{Motor}$ to bypassed flow of the inductor 208 through the second diode 214 during the motor mode. This ensures that no excessive energy is stored in the inductor 208 at the motoring mode and thus no energy is exchanged between the inductor 208 and the first and second capacitors 218, 220.

The inductor 208 is needed due to EMC constraint and therefore the Re-Generative current $I_{Re-Generation}$ is forced to flow through first diode 212 and the inductor 208 as well as the first capacitor 218, which works as L-C filter 2016. The L-C filter 216 ensures the Re-Generative current $I_{Re-Generation}$ is filtered to meet the EMC requirements and to eliminate the electrical emissions to the surrounding area of the vehicle, as well as to the battery 210.

As shown, only the Re-Generative current $I_{Re-Generation}$ flows through the second diode 212 as well as the inductor 208, therefore the energy $E_{Inductor\_Generation}$ stored in the Inductor 208 may be calculated as follows:

$$E_{Inductor\_Re-Generation} = \frac{V * I^2_{Re-Generation}}{2}, \quad (5)$$

where L is the value of the inductor 208.

As shown, the bypass second diode 214 ensures that no excessive energy is stored in the inductor 208 during the motor mode and thus ensures that no resonant-oscillation between the inductor 208 and the first and second capacitors 218, 220. During the Re-Generation mode, the battery charging current $I_{Re-Generation}$ is filtered by the combination of the inductor 208 and first capacitor 218 (together referred to as the L-C filter 216) to ensure that the quality of the battery charging current $I_{Re-Generation}$ meets the EMC regulatory constraint. In some examples, the battery 210 has a voltage of 48 Volts, the inductor 208 has an inductance of 2.2 micro Henry, the first capacitor 218 has a capacitance of 1200 micro Farad, and the second capacitance 220 has a capacitance of 470 micro Farad. Other values may be possible as well.

Figure 2A:
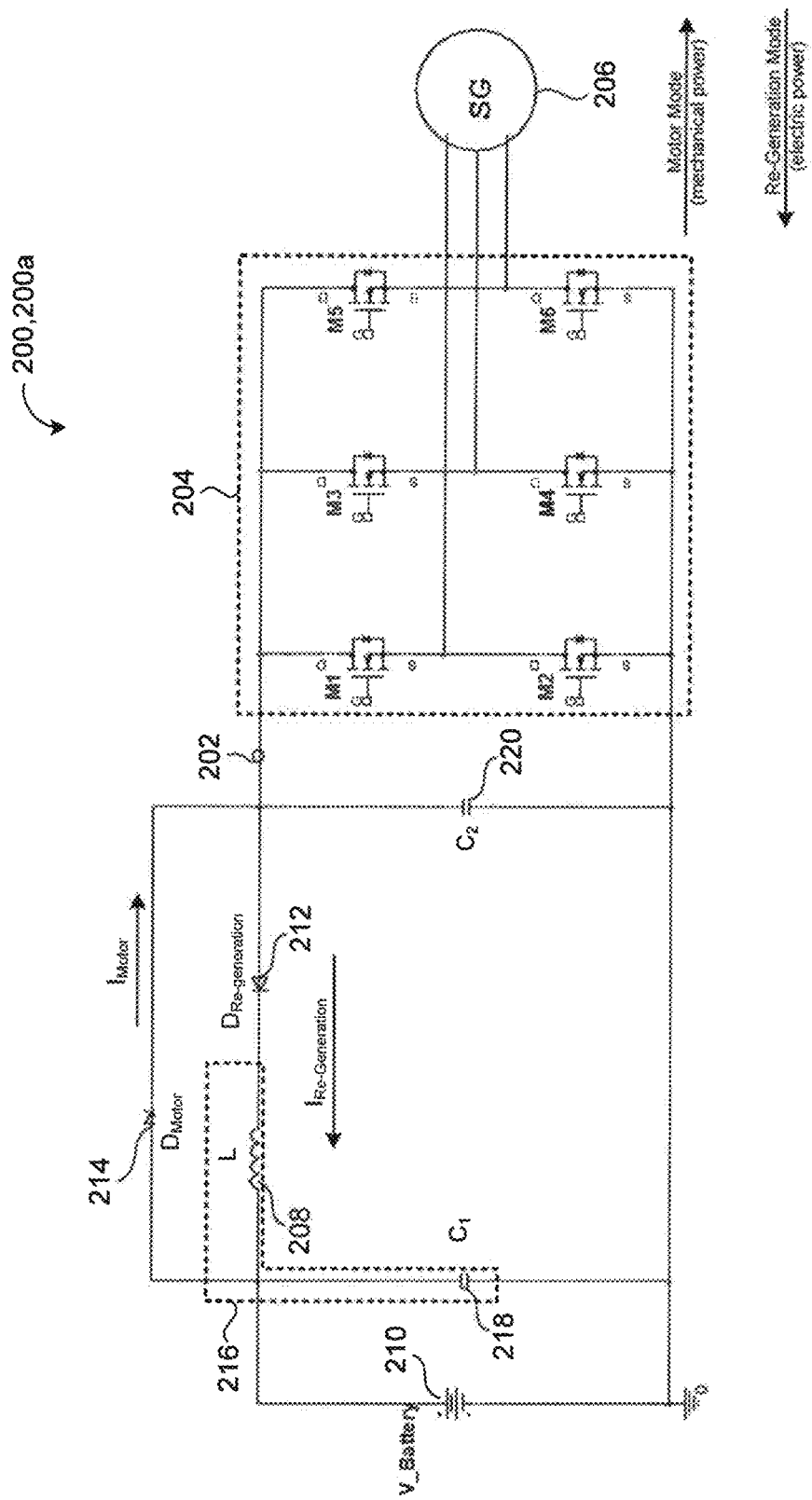
FIGS. 2A-2G are schematic views of exemplary topology of a main power section for a bidirectional-load.
Figure 2B:
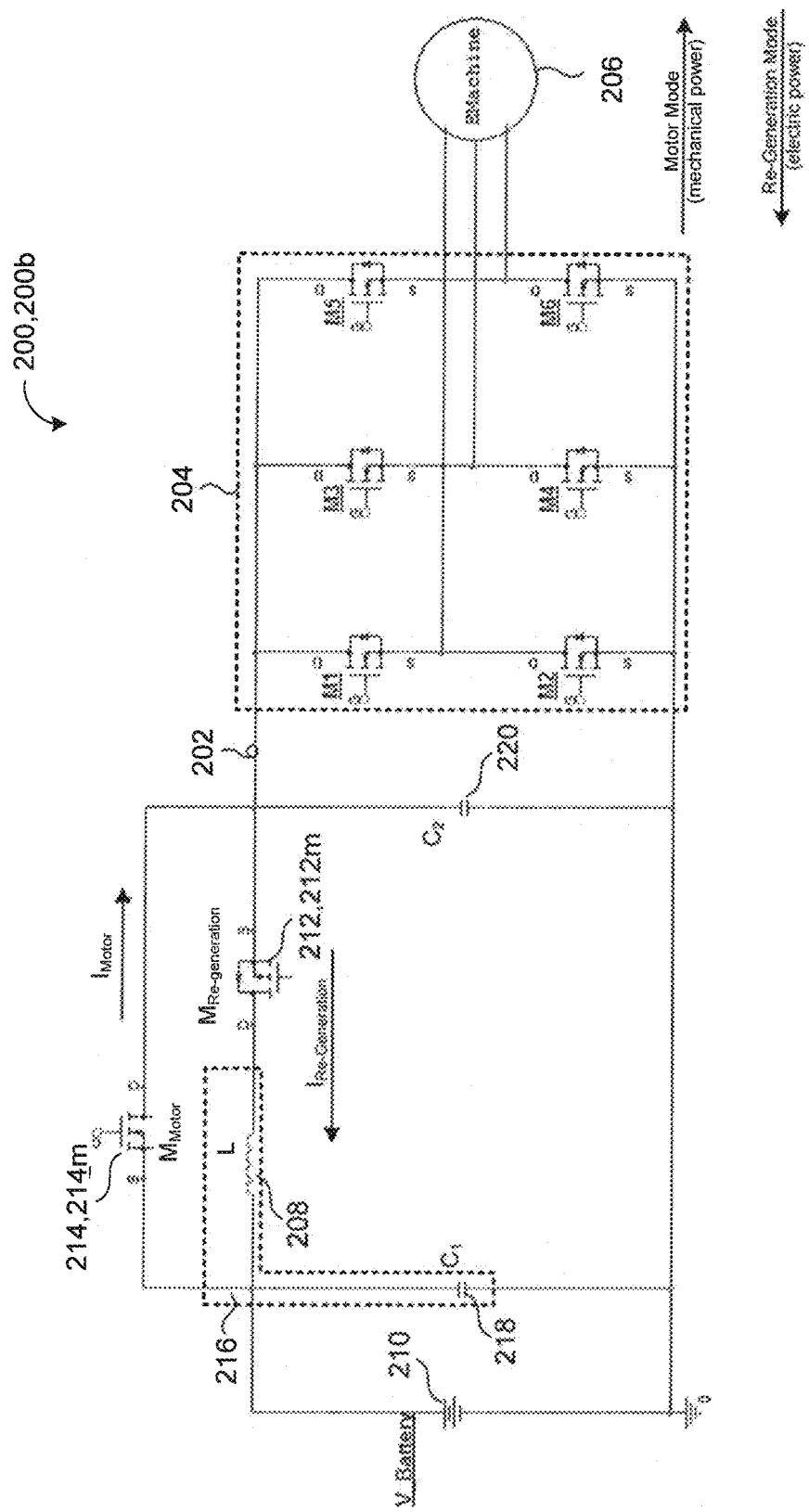
Figure 2C:
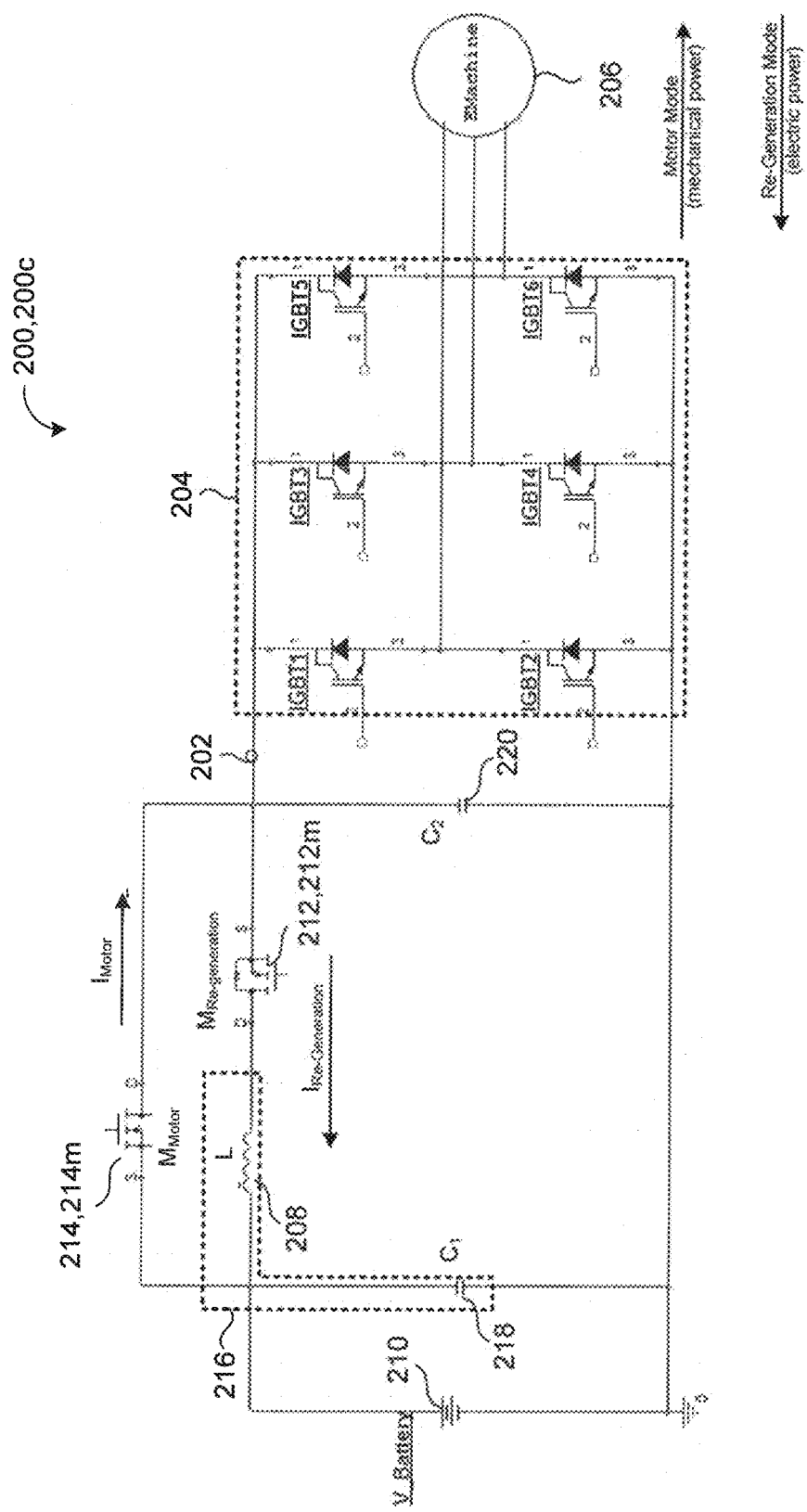

The system 200a described above relates to HEV 48V BSG applications; however, the system 200 may also be applied to all types of EV (Electric Vehicles) and PHEV (Plug-in hybrid electric vehicle) that utilize an electric machine's variable frequency which drives systems connected to the battery 210 as a power source for bidirectional current flow or bidirectional power flow which contains PWM Inverter—Converter and PI filter or CLC filter or LC filter on the DC BUS circuits, as shown in FIGS. 2B and 2C. The system also applies to all voltage levels battery applications from low voltage battery to high voltage battery applications in the vehicle. As shown in FIGS. 2E, 2F, and 2G, all types of 2 quadrant and 4 quadrant PWM Inverter—Converter of electric machine's variable frequency drives which may have resonant oscillations on the DC BUS circuits caused by the PI filter or CLC filter and or LC filter may be applied to this topology.

Referring to FIG. 2B, in some implementations, the first diode 212 and the second diode 214 are are replaced by a first MOSFET 212m and a second MOSFET 214m respectively. The MOSFETs 211m, 214m of M_Motor and M_Re_Generation provide better dynamic controls and reduces power losses thus increase the efficiency of the system 200b.

Referring to the system 200c shown in FIG. 2C, the power inverter/converter 204 may include power switching elements IGBT (insulated-gate bipolar transistor). The power inverter/converter 204 (i.e., the 3 phase PWM power switching elements) have been described for using power MOSFETs for 48V BSG application as shown in FIGS. 2A and 2B. However, for high voltage high power applications including any type of REV, EV, PHEV applications, the power inverter/converter 204 may include power switching elements IGBT.

In some implementations, as shown in FIGS. 2D-2G, all type of DC-DC Converter including 2 quadrant and 4 quadrant DC-DC Converters may be used as the power inverter/converter 204 to eliminate the resonant oscillation on the DC BUS circuits which is caused by the PI filter or CLC filter and or the LC filter. The DC-DC Converter 204 may include a DC-DC Buck Converter, DC-DC Boost Converter, and a DC-DC Boost-Buck Converter. In other examples, the DC-DC Converter 204 includes a DC-DC Buck-Boost Converter.

Figure 2D:
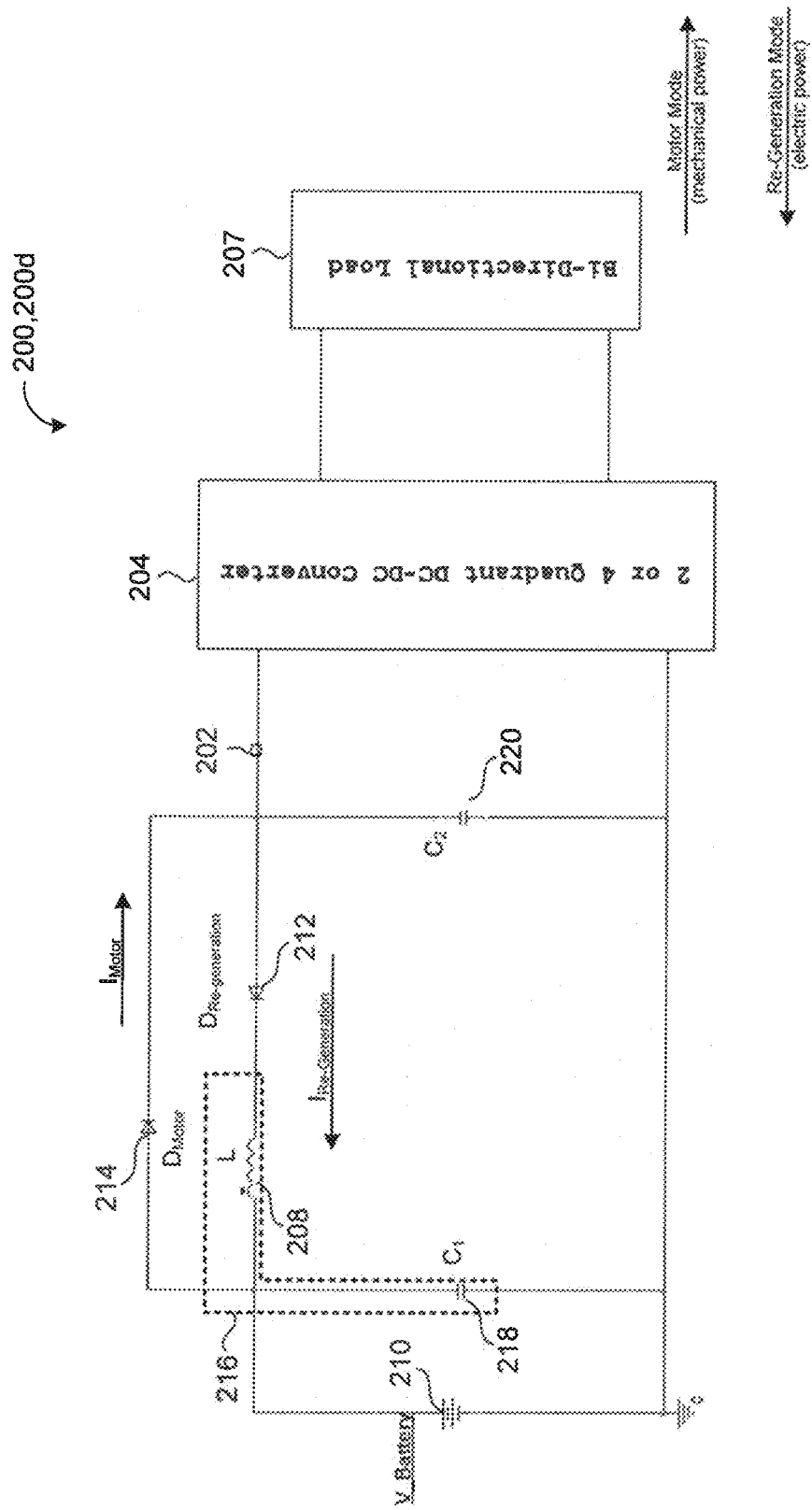
Figure 2E:
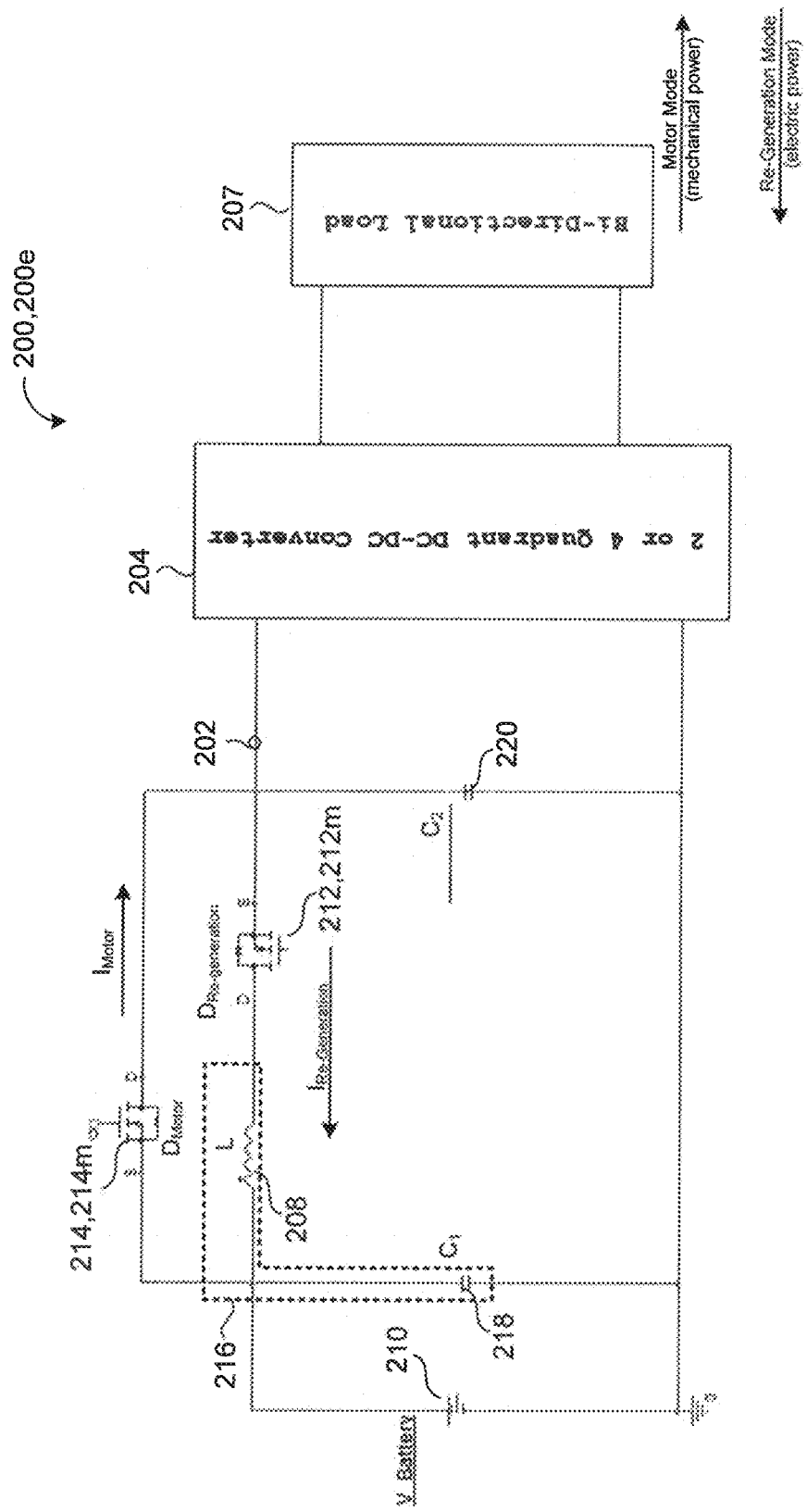
Figure 2F:
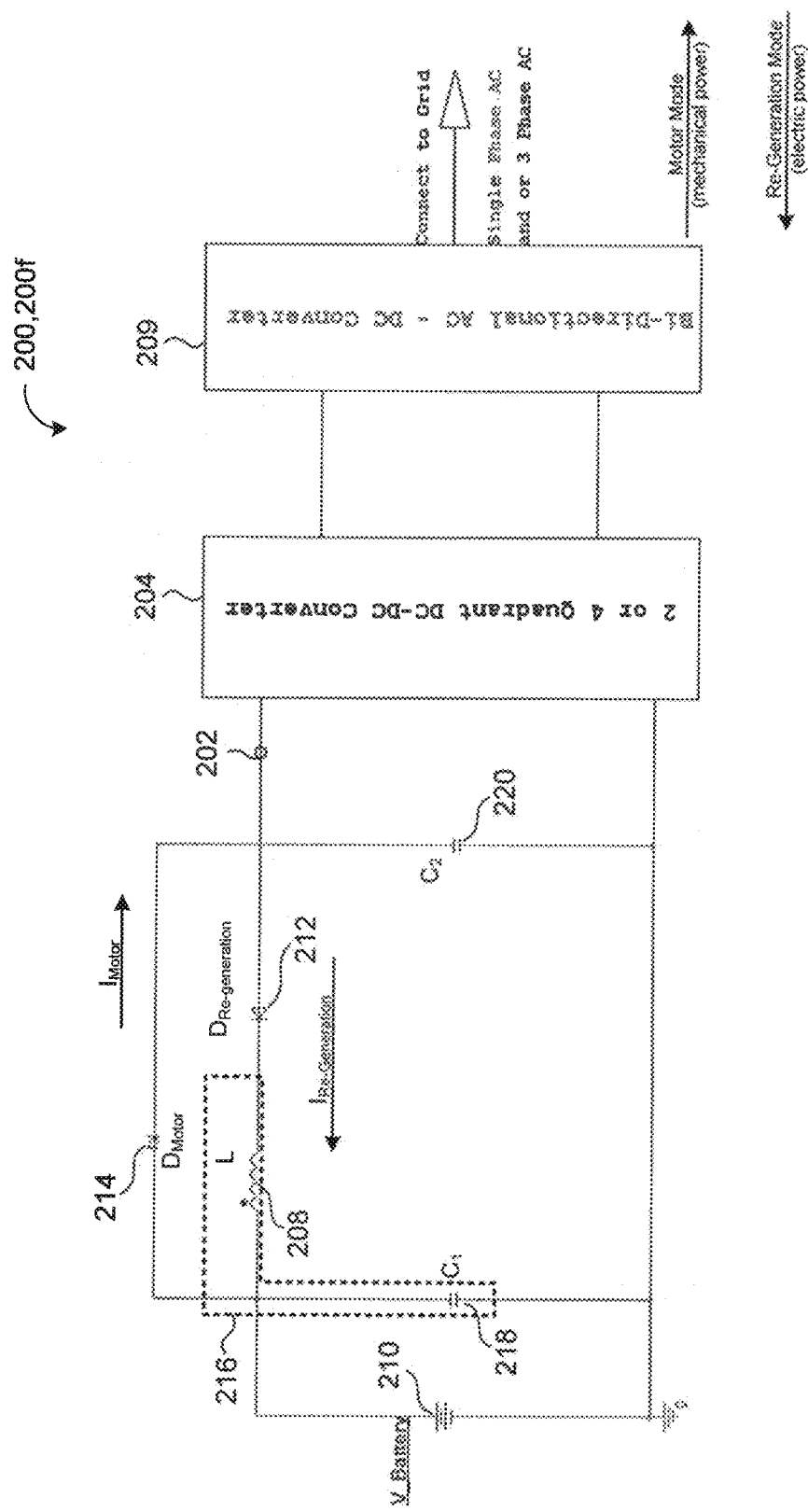
Figure 2G:
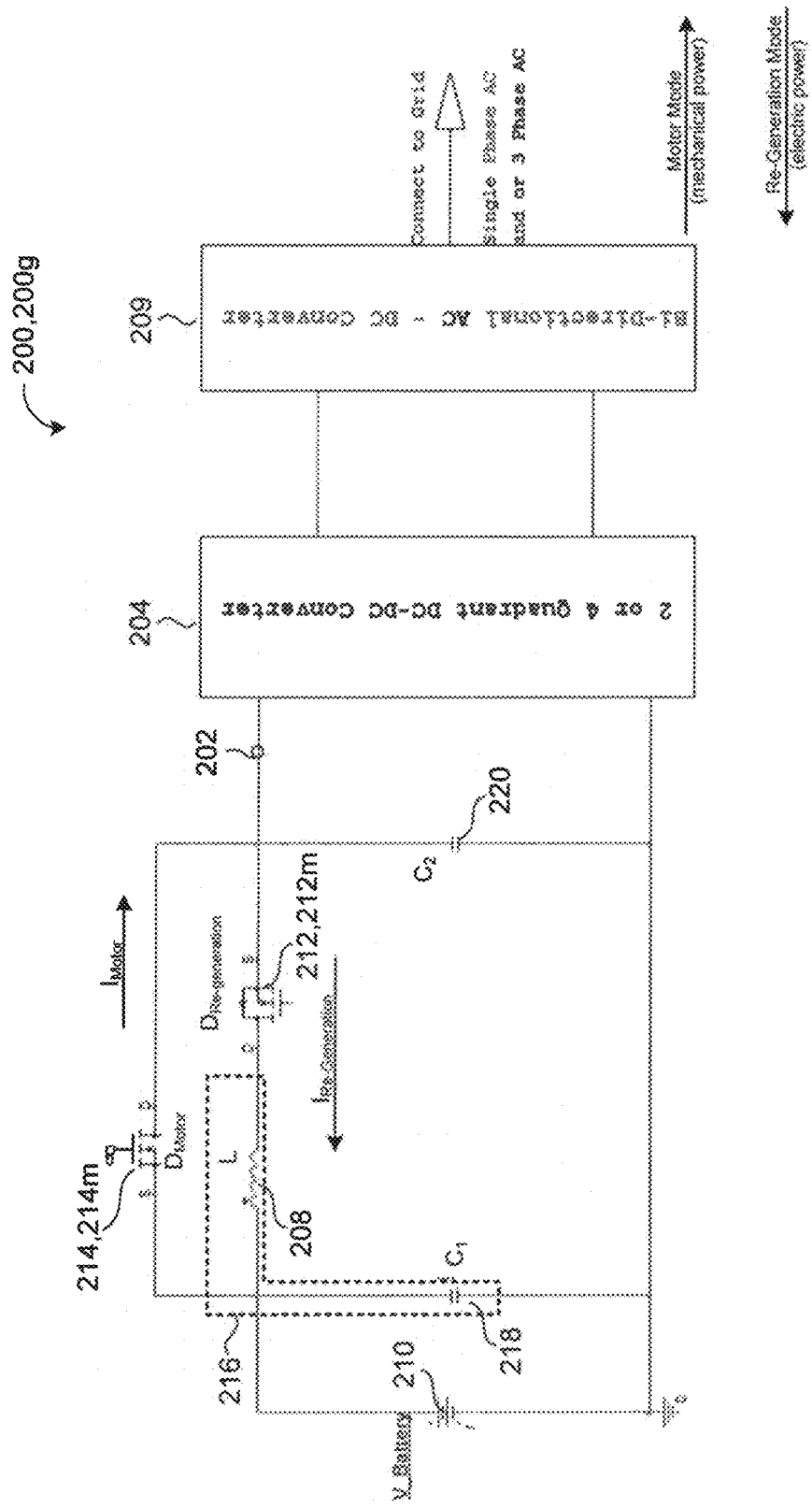

The system 200d, 200e shown in FIGS. 2D and 2E include a bi-directional load 207 which allows the current to flow at in both directions. The electrical current flows from the battery 210 through the DC BUS 202 to the bi-directional load 207 during a sink mode and the bi-directional load 207 absorbs electrical energy from the battery source 210. On the other hand, the bi-directional load 207 may perform, during a source mode, and generate electrical energy so that the current flows from bi-directional load 207 to the battery 210 through the DC BUS 202.

FIGS. 2D and 2F show the system 200d, 200f having the DC-DC Converter 204 with the first diode 212 and the second diode 214, while FIGS. 2E and 2G show the system 200e, 200g with the first MOSFET 212m and the second MOSFET 214m for better dynamic controls and reduces power losses thus increase the efficiency.

Referring to FIGS. 2F and 2G, the system 200f and 200g may be connected to an On-Board Charger 209 which converts AC power into DC energy to be stored by the vehicle. In this case, a plug-in single-phase AC power input and or 3 phase AC power input is connected to a bi-directional AC-DC converter. The first and second diodes 212, 214 performs natural commutation when needed to eliminate the resonant oscillation on the DC BUS 202 caused by the PI filter or CLC filter or LC filter of the system 200f and 200g.

FIGS. 3-10C illustrate simulation models and results in accordance with the description of both FIGS. 1 and 2. Two simulation models are provided using Matlab-Simulink.

Figure 3:
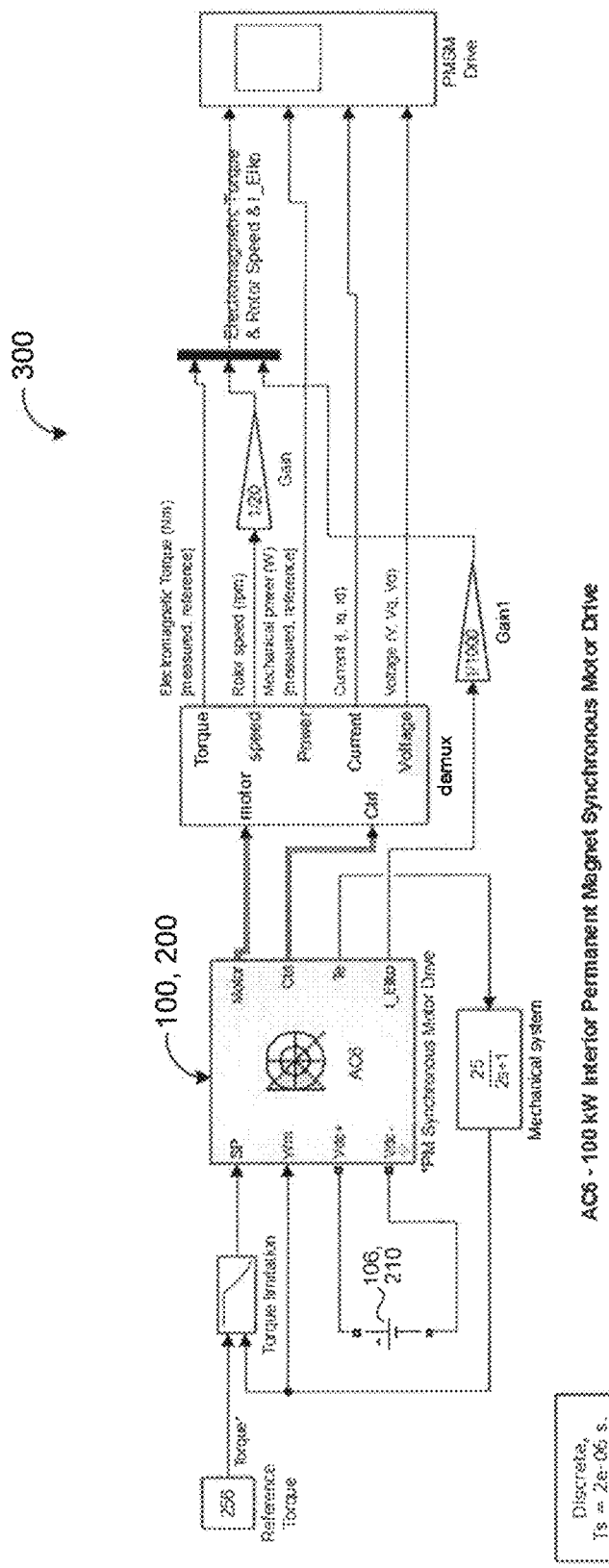
FIG. 3 is a top Simulink Model view of a main power topology with 100 KW interior permanent magnet motor variable frequency drive.

FIGS. 3-5B illustrate a Matlab-Simulink Model using 100 KW Interior Permanent Magnet Synchronous Motor Drive. Referring to FIG. 3, a Main Power Topology with 100 KW Interior Permanent Magnet Synchronous Motor Drive is illustrated, and generally referred to as 300.

Figure 4A:
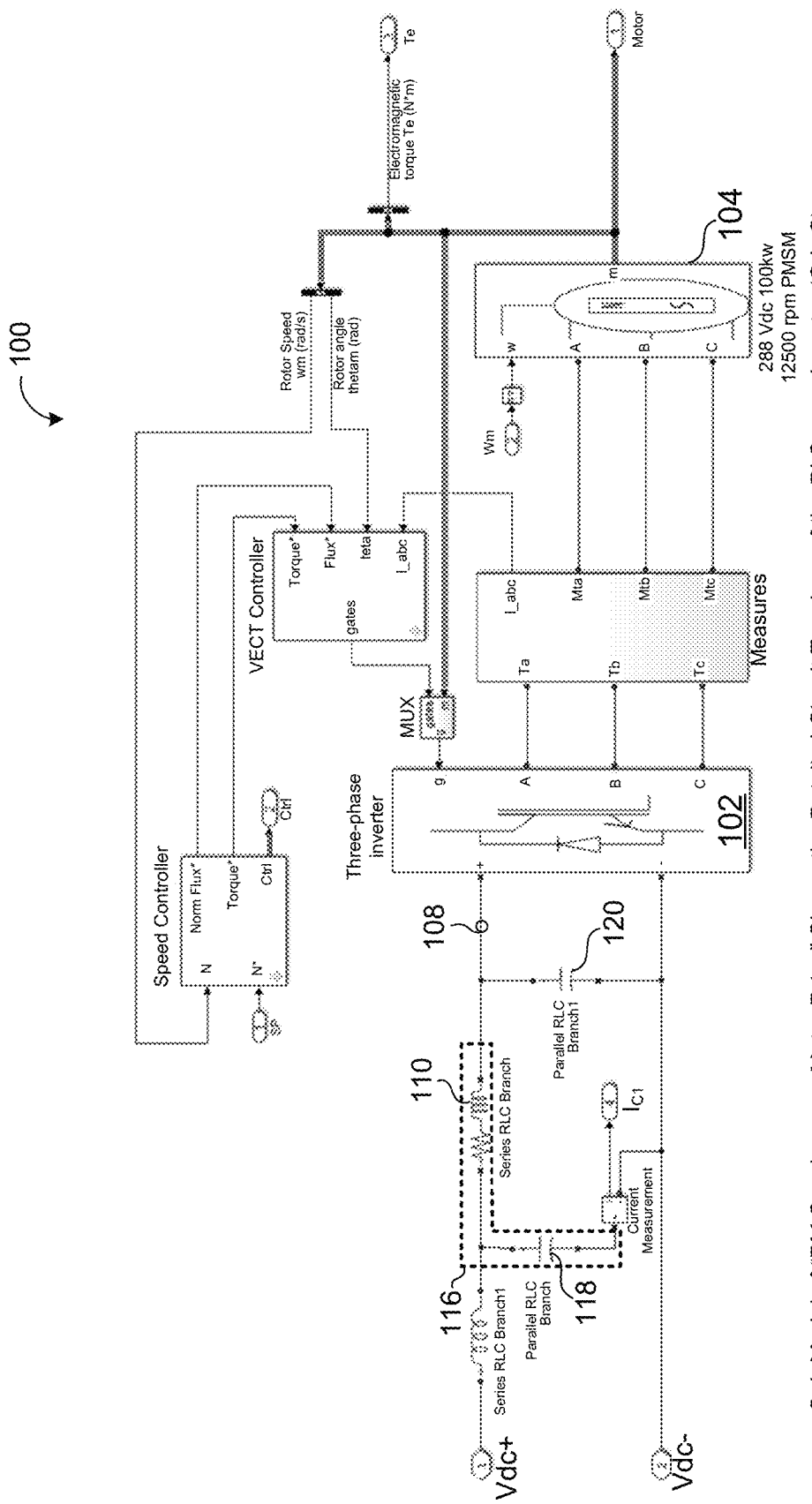
FIG. 4A is a Simulink Model view of a Sub-Model of a permanent magnet synchronous motor drive that shows the detailed circuit topology of the PI-Source Inverter (C-L-C) of FIG. 3, in accordance with FIG. 1.
Figures 4, 5B:
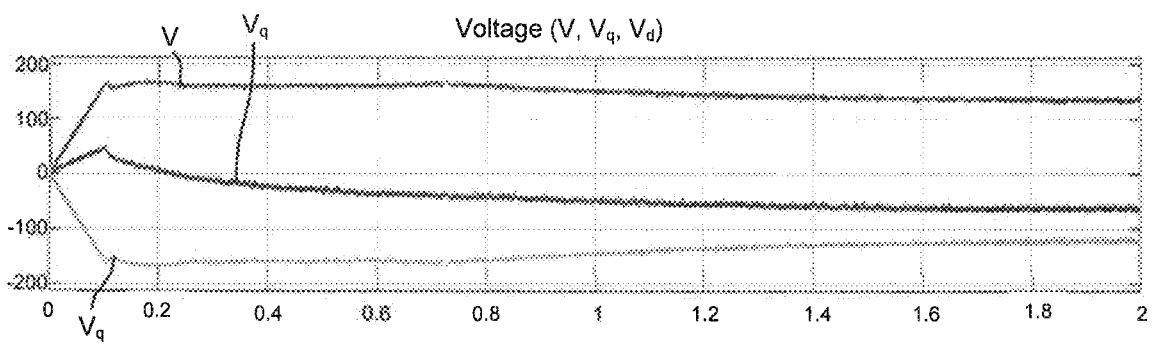

FIG. 4A illustrates the Sub Model of the Permanent Magnet Synchronous Motor Drive shown in FIG. 3 according to the implementation of FIG. 1 (prior art), which shows the detailed circuit topology of the PI Source Inverter (C-L-C). FIGS. 4B-1 to 4B-4, show the simulation results, which show the resonant oscillation on most of the parameter values. FIG. 4B-1 shows a graph of a motor torque reference 402, a motor torque measurement 404, a rotor speed 406 of the starter generator 104, and the current $I_{C1}$ going through capacitor C1 generally referred to as 408. As can be seen, as the motor torque reference 402 and the motor torque measurement decreases, the rotor speed 406 of the starter generator 104 increases, while the current $I_{C1}$ going through capacitor C1 218 generally referred to as 408 remains constant. FIG. 4B-2 shows a graph of the mechanical power (W) of the starter generator 104 and illustrates a reference mechanical power 410 and the measured mechanical power 412. FIGS. 4B-3 and 4B-4 illustrate currents and voltages respectively. I is the current passing through the DC bus 108 as well as the inductor 110 and V is the phase voltage of the electric machine, i.e., starter generator 104. $I_q$ is the phase current of the starter generator 104 decoupled in quadrature axis and $V_d$ is the associated phase voltage of the starter generator 104 decoupled in quadrature axis. $I_d$ is the phase current of the starter generator 104 decoupled in direct axis and $V_d$ is the associated phase voltage of the starter generator 104 decoupled in direct axis.

FIG. 5A shows a Sub Model of the Permanent Magnet Synchronous Motor Drive shown in FIG. 3 based on the system 200 described in FIGS. 2A-2H for eliminating the Resonant Oscillation. FIGS. 5B-1-5B-4 show simulation results that show the effect of the elimination of resonant oscillation on all of the parameter values (as compared to the prior art results shown in FIG. 4B) due to the addition of the two diodes 212 and 214 (FIG. 2, FIG. 5A in comparison with FIG. 1 and FIG. 4A respectively). FIG. 5B-1 shows a graph of a motor torque measurement 504, rotor speed 506 of the starter generator 206, and the current $I_{C1}$ going through capacitor C1, 218 generally referred to as 508. As can be seen, as the motor torque measurement 504 decreases, the rotor speed 506 of the starter generator 206 increases, while the current $I_{C1}$ going through capacitor C1, 218 generally referred to as 508 remains constant. FIG. 5B-2 shows a graph of the mechanical power (W) of the starter generator 206 and illustrates a reference mechanical power 510 and the measured mechanical power 512. FIGS. 5B-3 and 5B-4 illustrate currents and voltages respectively. I is the current passing through the DC bus 202 as well as the inductor 208 and V is the phase voltage of the starter generator 206. $I_q$ is the phase current of the electric machine decoupled in quadrature axis and $V_q$ is the associated phase voltage of the starter generator 206 decoupled in quadrature axis. $I_d$ is the phase current of the starter generator 206 decoupled in direct axis and $V_d$ is the associated phase voltage of the starter generator 206 decoupled in direct axis. As previously mentioned, the resonant oscillation is significantly reduced on all of the parameter values in FIGS. 5A-5B-4.

Figure 6:
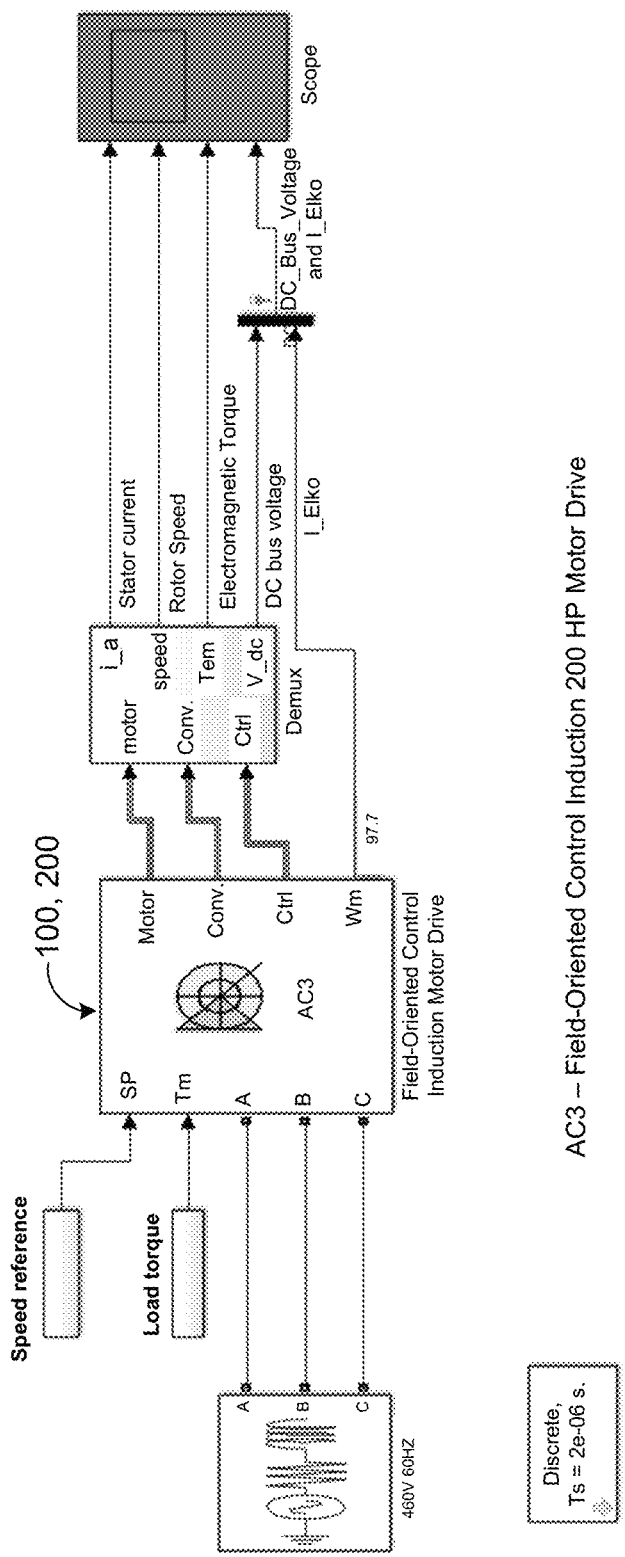
FIG. 6 is a top Simulink Model view of a main power topology with a 3-phase induction machine variable frequency drive using Field-Oriented-Control.
Figure 7A:
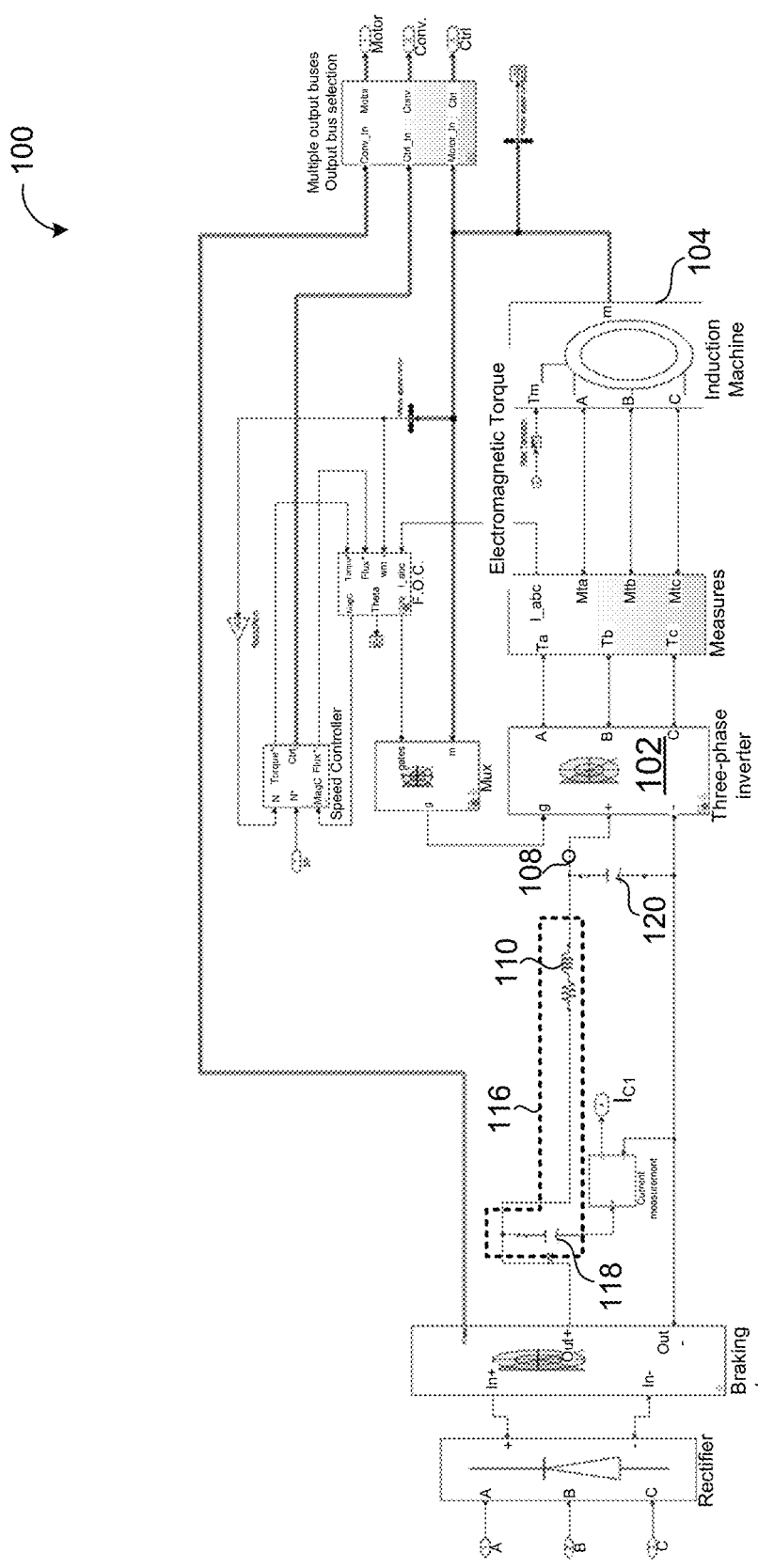
FIG. 7A is a Simulink Model view of a sub-model of Field-Orient-Control induction motor drive that shows the detailed circuit topology of the PI Source Inverter (C-L-C) based on FIG. 6, in accordance with FIG. 1.

FIGS. 6-8B illustrate Matlab-Simulink Model using 3 Phase Induction Machine's Variable Frequency Drive with Field-Oriented-Control (FOC). FIG. 6 shows a Simulink top model with the 3 Phase Induction Machine's Variable Frequency Drive using FOC (Field-Orient-Control). FIG. 7A shows a Sub Model of the "Field-Orient-Control Induction Motor Drive" shown in FIG. 6, which shows the Detailed Circuit Topology of the PI Source Inverter (C-L-C) based on the prior art described in FIG. 1. FIGS. 7B-1 to 7B-4 show the simulation results of FIG. 7A that shows the resonant oscillation on most of the parameter values. FIG. 7B-1 shows a graph that includes the stator current, i.e., the current from the starter generator 104. FIG. 7B-2 shows a graph of a reference rotor speed 702 verses a measured rotor speed 704. The rotor speed is the speed of the rotor of the starter-generator 104. FIG. 7B-3 shows a graph of a reference electromagnetic torque 706 and a measured electromagnetic torque 708 on the shaft of the starter generator 206. FIG. 7B-4 shows the DC-Bus voltage $V_{108}$ and the associated current $I_{108}$.

Figure 8A:
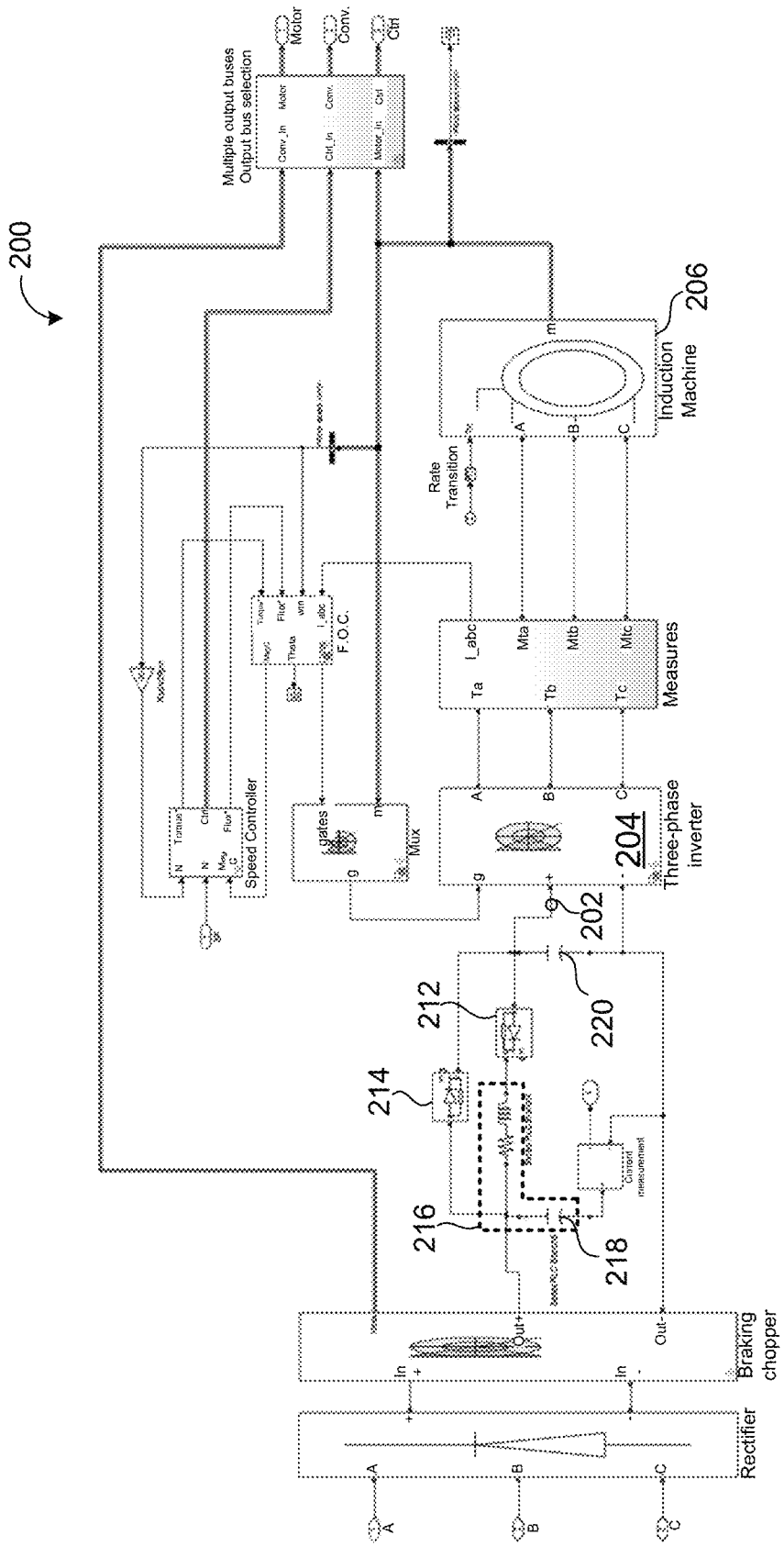
FIG. 8A is a Simulink Model view of a sub-model of Field-Orient-Control induction motor drive for Eliminating the Resonant Oscillation based on the system as shown in FIG. 6 and in accordance with the system of FIG. 2.
Figures 1, 8B:
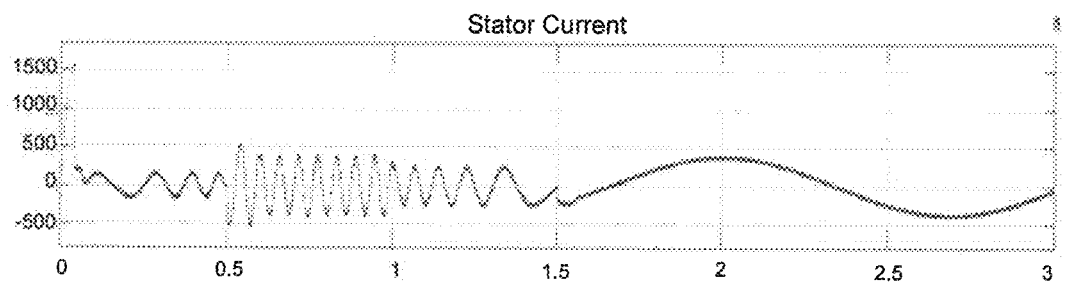
Figures 2, 8B:
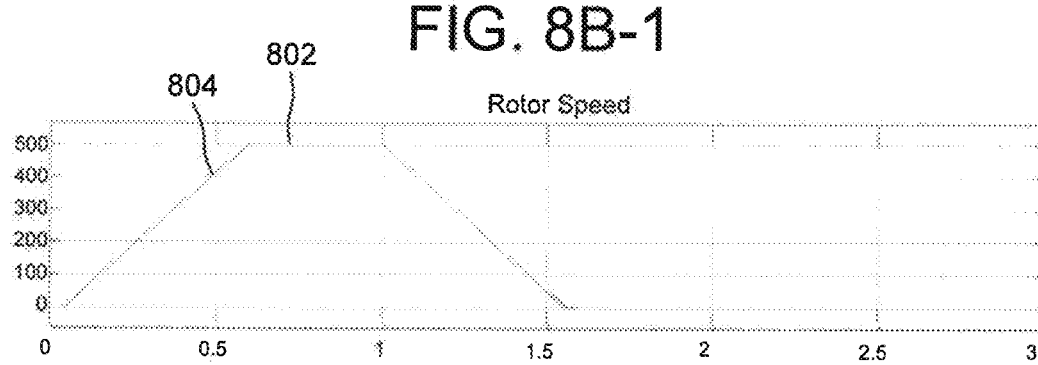
Figures 3, 8B:
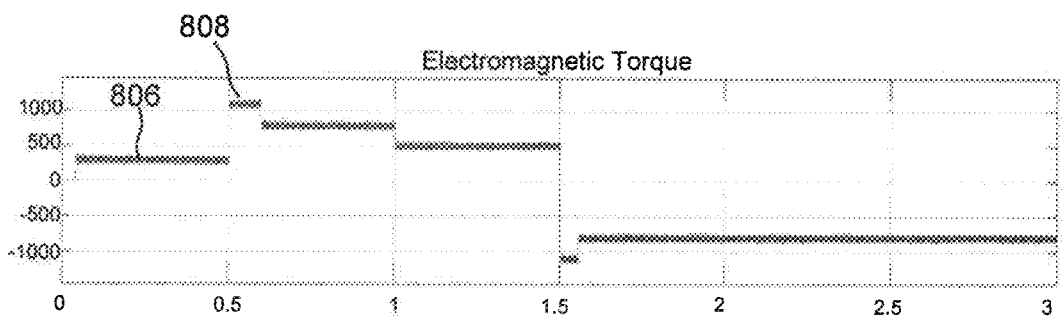
Figures 4, 8B:
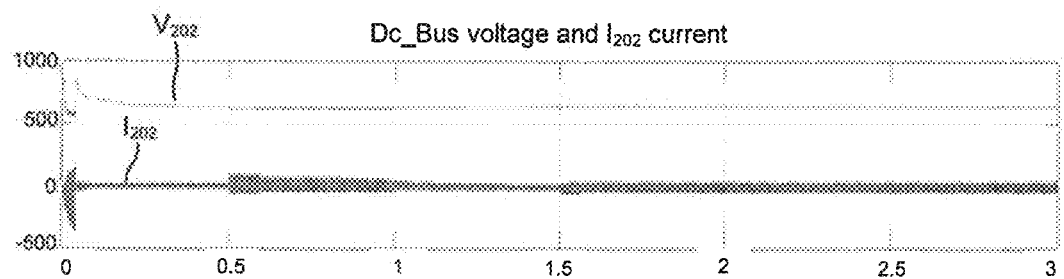

FIG. 8A shows the Sub Model of the "Field-Orient-Control Induction Motor Drive" shown in FIG. 6 for eliminating the Resonant Oscillation based on the system as described in FIG. 2. FIG. 8B shows the simulation results of FIG. 8A which show the effect of elimination of resonant oscillation on all of the parameter values. FIG. 8A-1 shows a graph that includes the stator current, i.e., the current from the starter generator 206. FIG. 8B-2 shows a graph of a reference rotor speed 802 verses a measured rotor speed 804. The rotor speed is the speed of the rotor of the starter-generator 206. FIG. 8B-3 shows a graph of a reference electromagnetic torque 806 and a measured electromagnetic torque 808 on the shaft of the starter generator 206. FIG. 8B-4 shows the DC-Bus voltage $V_{202}$ and the associated current 1202. As previously mentioned, the resonant oscillation is significantly reduced on all of the parameter values in FIGS. 8A-8B-4.

Therefore, and based on the above simulations, the benefits of the system shown in FIG. 2 include increasing the reliability of the main power section and stabilizing all the power sections by eliminating the resonant oscillations, reducing the power losses and heat on the main power section and thus extending the lifetime of the main power components, reducing the current rating of the inductor 208 from 260A to 40A, reducing the current rating of the first capacitor 218 capacitor from 9.5A (RMS) to less, and no need to de-rate the BSG inverter 204 and motor/re-generator power rating. As such, the starter-generator 206 including the inverter 204 and motor/re-generator may be used at its full power rating. Current rating, also known as current-carrying capacity or ampacity, is the maximum amount of electric current a conductor or device can carry before sustaining immediate or progressive deteriorations.

In addition, and based on the results of the simulations discussed, the different types of the simulation results have shown the resonant oscillation as well as the ripple current elimination effect at the same level as a result of the design of FIGS. 2A-2G as compared to the prior art shown in FIG. 1.

As shown and discussed with respect to FIGS. 2A-2G and the associated figures discussing the simulations of FIGS. 2A-2G, the system 200 better controls the current flow on the inductor 208 based on the two different operational modes (Motor Mode and Re-Generation Mode). As such, the disclosed system 200 meets the constraints of the automotive level EMC, and significantly eliminates the resonant oscillation that is caused by the inductor 208. Therefore, the starter-generator 206a can operate at full power without any de-ration, which increases the stability, reliability, and lifetime of the BSG system.

Since the two diodes 212, 214 are passive components, there is no need for triggering circuits or controls. Therefore, no other additional circuits or components are required.

The above disclose may be used in all types of HEVs that adopt an electric machine's variable frequency drives, because all types of HEVs require a Re-Generation mode at breaking or down hills mode for catching the vehicle's kinematic energy and convert it to be electrical energy through the converter and charging the battery 210. The described disclosure is not limited to a 48V BSG, but is also applicable to any type of HEV that uses inverter and converter 204. A number of implementations have been described. Nevertheless, it will be understood that various modifications may be made without departing from the spirit and scope of the disclosure. Accordingly, other implementations are within the scope of the following claims. For example, the actions recited in the claims can be performed in a different order and still achieve desirable results.

What is claimed is:

1. A system for reducing a resonant oscillation on a direct current bus, the system comprising:
    a battery;
    a first capacitor connected in parallel with the battery;
    an inductor connected in series with the first capacitor;
    a first element connected in series with the inductor;
    a second element connected in parallel with the inductor and the first element;
    a second capacitor connected in series with the first element; and
    an electric machine connected to the second capacitor;
    wherein:
        during a re-generation mode for charging the battery, a re-generation current flows from the electric machine to the battery, passing through the first element and the inductor and bypassing the second element; and
        during a motor mode, a motor current flows from the battery to the electric machine, passing through the second element and bypassing the first element and the inductor.

2. The system of claim 1, wherein the first element is a MOSFET.

3. The system of claim 1, wherein the second element is a MOSFET.

4. The system of claim 1, wherein the first capacitor and the inductor form an L-C filter.

5. The system of claim 1, wherein during the re-generation mode for charging the battery, the re-generation current flows through the first capacitor and the inductor respectively.

6. The system of claim 1, further comprising a power inverter/converter connected between the electric machine and the second capacitor.

7. The system of claim 6, wherein the power inverter/converter comprises six MOSFETS each including a diode.

8. The system of claim 6, wherein the power inverter/converter comprises six insulated-gate bipolar transistors (IGBT).

9. The system of claim 6, wherein the power inverter/converter comprises a four quadrant DC-DC converter.

10. The system of claim 6, wherein the power inverter/converter comprises a two quadrant DC-DC converter.

11. The system of claim 6, wherein:
   during the motor mode, the power inverter/converter includes an inverter from DC to 3-phase AC sinusoidal; and
   during the re-generation mode, the power inverter/converter includes a converter from 3-phase AC sinusoidal to DC.

12. The system of claim 1, wherein the electric machine is a starter-generator.

13. The system of claim 1, wherein the electric machine is a bi-directional load.

14. The system of claim 1, wherein the electric machine is an on-board charger.

* * * * *